United States Patent [19]

Miyata et al.

[11] Patent Number: 4,706,219
[45] Date of Patent: Nov. 10, 1987

[54] WORD LENGTH SELECTABLE MEMORY

[75] Inventors: Shinobu Miyata; Takashige Kinouchi, both of Tokyo, Japan

[73] Assignee: NEC Corporation, Tokyo, Japan

[21] Appl. No.: 850,302

[22] Filed: Apr. 10, 1986

[30] Foreign Application Priority Data

Apr. 10, 1985 [JP] Japan .................................. 60-75734

[51] Int. Cl.[4] .............................................. G11C 7/00
[52] U.S. Cl. ..................................... 365/189; 365/230
[58] Field of Search ......................... 365/189, 230, 233

[56] References Cited

U.S. PATENT DOCUMENTS 4,507,759 3/1985 Yasui et al. ........................ 365/189

Primary Examiner—Joseph A. Popek
Attorney, Agent, or Firm—Sughrue, Mion, Zinn, Macpeak & Seas

[57] ABSTRACT

An integrated circuit ROM comprises a memory cell matrix having a plurality of pairs of output lines, and plurality of pairs of external terminals. An output selection circuit is connected between the output lines and the external terminals and adapted to connect the output lines to the corresponding external terminals in a first mode and to alternatively connect output lines of each output line group to one predetermined external terminal of the corresponding external terminal group in a second mode. A control circuit is connected to at least one given external terminal which is disconnected from the corresponding output line when the output selecting circuit is in the second mode. This control circuit is in response to an address signal from the given external terminal to control the output selection circuit so as to cause it to selectively connect one output line of each output line group to the above predetermined external terminal of the corresponding external terminal group. Further, a mode selection circuit is associated to the output selection circuit and has a circuit structure fixed by a selected code mask so as to put the output selection circuit in a predetermined one of the first and second modes.

19 Claims, 7 Drawing Figures

| BIT STRUCTURE | | OUTPUT 1 BIT | OUTPUT 2 BIT | |
|---|---|---|---|---|
| Bm | | H | L | |
| TERMINALS | $O_{2i}/A_{-1}$ | — | L | H |
| | CO | L | H | L |
| | $O_{2i}/A_{-1}$ | $a_1$ | Hi-Z | |
| | $O_i$ | $a_2$ | $a_1$ | $a_2$ |

WORD LENGTH SELECTABLE MEMORY

BACKGROUND OF THE INVENTION

1. Field of the Invention

The present invention relates to an integrated circuit memory which can be used as a read only memory, a random access memory, and the like, and more specifically to such a memory whose word length can be selected in accordance with selection of a code mask.

2. Description of the related art

With a recent development of microcomputers, a integrated circuit memory such as a read only memory (ROM), a random access memory (RAM) and the like is forced to shift from N words of 8 bits to N words of 16 bits and further to N words of 32 bits. At present, however, all the types of memory structures are still much in commercial demand. In compliance with the demand, makers have to prepare all the types of memory structures. For the purpose, the makers must design a memory for each required memory structure. Otherwise, it is necessary to prepare a memory adapted such that the memory structure can be modified from external terminals. However, the former method needs a large steps of design processes and a variety of memories must be inevitably prepared, so that the efficiency of production will be low and at the same time the memories are expensive. On the other hands, the latter method is not practical since the number of the terminals is limited.

SUMMARY OF THE INVENTION

Accordingly, it is an object of the present invention to provide a memory which has dissolved the above mentioned drawback in the prior art.

Another object of the present invention is to provide a memory whose memory structure can be modified in the course of manufacturing process with no additional terminal.

Still another object of the present invention is to provide a memory whose word length can be changed by only selection of a code mask used in the course of memory producing process, so that a variety of memories can be inexpensively produced at a high productivity without requiring many steps of design process.

The above and other object of the present invention are achieved in accordance with the present invention by a memory comprising a memory cell matrix having a plurality of groups of output lines each group including at least two output lines; a plurality of groups of external terminals each group including at least two external terminals; output selection means connected between the output lines and the external terminals and adapted to connect the output lines to the corresponding external terminals in a first mode and to alternatively connect output lines of each output line group to one predetermined external terminal of the corresponding external terminal group in a second mode; control means connected to at least one given external terminal which is disconnected from the corresponding output line when the output selecting means is in the second mode, the control means being in response to a signal from the given external terminal to control the output selection means so as to cause it to selectively connect one output line of each output line group to the above predetermined external terminal of the corresponding external terminal group; and mode selection means associated to the output selection means and having a circuit structure fixed by a selected code mask so as to put the output selection means in a predetermined one of the first and second modes.

With the above arrangement, with selection of a code mask used in the course of memory manufacturing process, the output selection means is put either in the first mode or in the second mode by the mode selection means. If each group of output lines has two output lines, all the external terminals are active in the first mode, and therefore, the memory will have the word length equal to the number of the external terminals. In this case, the number of the words is determined by the number of the memory cells associated with each output line. In the case that the output selection means is in the second mode, one half of the external terminals are active but the other half of the external terminals are inactive. Therefore, the word length is a half of the number of the output lines, but the number of the words is twice the number of the memory cells associated with each output line. In this case, the one predetermined external terminal which is inactive as a data output is used as an additional address input. Thus, the two types of memory structures can be produced with only change of a code mask without increase of external terminal and without requiring two memory designs. In addition, if the number of the external terminals contained in each external terminal group is suitably selected, various memory structures can be produced.

In one embodiment of the memory in accordance with the present invention, the output selection means includes pass-through transfer gate means connected between the above predetermined external terminal of each external terminal group and the corresponding one output line of the corresponding output line group, cross transfer gate means connected between the above predetermined external terminal of each external terminal group and at least one remaining output line of the same output line group, and isolation transfer gate means connected between at least one remaining external terminal of each external terminal group and the corresponding output line. With this structure, when the output selection means is in the first mode, the pass-through and isolation transfer gate means are put in an ON condition while the cross transfer gate means are put in an OFF condition. When the output section means is in the second mode, the isolation transfer gate means is put in an OFF condition and the pass-through and cross transfer gate means are alternatively put in an ON condition and in an OFF condition by the control means.

Further, the control means includes one input connected to the given external terminal and an output connected directly to one of the pass-through and cross transfer gate means and though an inverter to the other of the pass-through and cross transfer gate means. Specifically, the control means includes an OR gate connected at its one input to the given external terminal, and the mode selection means is connected at its output to the isolation transfer gate means and another input of the OR gate. In addition, the mode selection means has an input selectively and fixedly connected to one of the ground and a supply voltage in accordance with the selected code mask.

In one preferred embodiment, the memory cell matrix has (j+1) address input lines and 2i output lines divided into i groups each including two output lines. In this case, if the output selection means is in the first mode, the memory has the memory structure of $2^{j+1}$ words of 2i bits. To the contrary, if the output selection means is in the second mode, the given external terminal is used as an additional address input and the memory has the memory structure of $2^{j+2}$ words of i bits.

In another preferred embodiment, the memory cell matrix has (j+1) address input lines and 4i output lines divided into i groups each including four output lines, and the cross transfer gate means includes first, second and third cross transfer gates connected at their one end to the predetermined external terminal of each external terminal group. The other ends of these cross transfer gates are connected to the remaining three output lines of the corresponding output line group, respectively. Further, the isolation transfer gate means has three isolation transfer gates between the remaining three output lines of each output line group and the corresponding external terminals, respectively, so that when the output selection means is in the second mode, all the isolation transfer gates are put in an OFF condition, and the pass-through transfer gate means and the first, second and third transfer gates are alternatively put in an ON condition by the control means.

In this embodiment, the mode selection means includes a first output connected to all the isolation transfer gates and a second output adapted to have the same logical level as that of the first output and connected to all the pass-through transfer gate means. The mode selection means also includes an input selectively and fixedly connected to one of the ground and a supply voltage in accordance with the selected code mask.

Further, the control means includes a decoder having two inputs connected to two given external terminals which are disconnected from the corresponding output lines when the output selection means is in the first mode. This decoder also has four outputs connected to the pass-through transfer gate means and the first, second and third cross transfer gates, respectively, so as to put one of these transfer gates in the ON condition. Further, the decoder is adapted to be activated by the mode selection means when the output selection means is in the second mode.

In the embodiment, if the output selection means is in the first mode, the memory has the memory structure of $2^{j+1}$ words of 4i bits. But, if the output selection means is in the second mode, the two given external terminals are used as additional address inputs and the memory has the memory structure of $2^{j+4}$ words of i bits.

The above and other objects, features and advantages of the present invention will be apparent from the following description of preferred embodiments of the invention with reference to the accompanying drawings.

DESCRIPTION OF THE PREFERRED EMBODIMENTS

Figure 1:
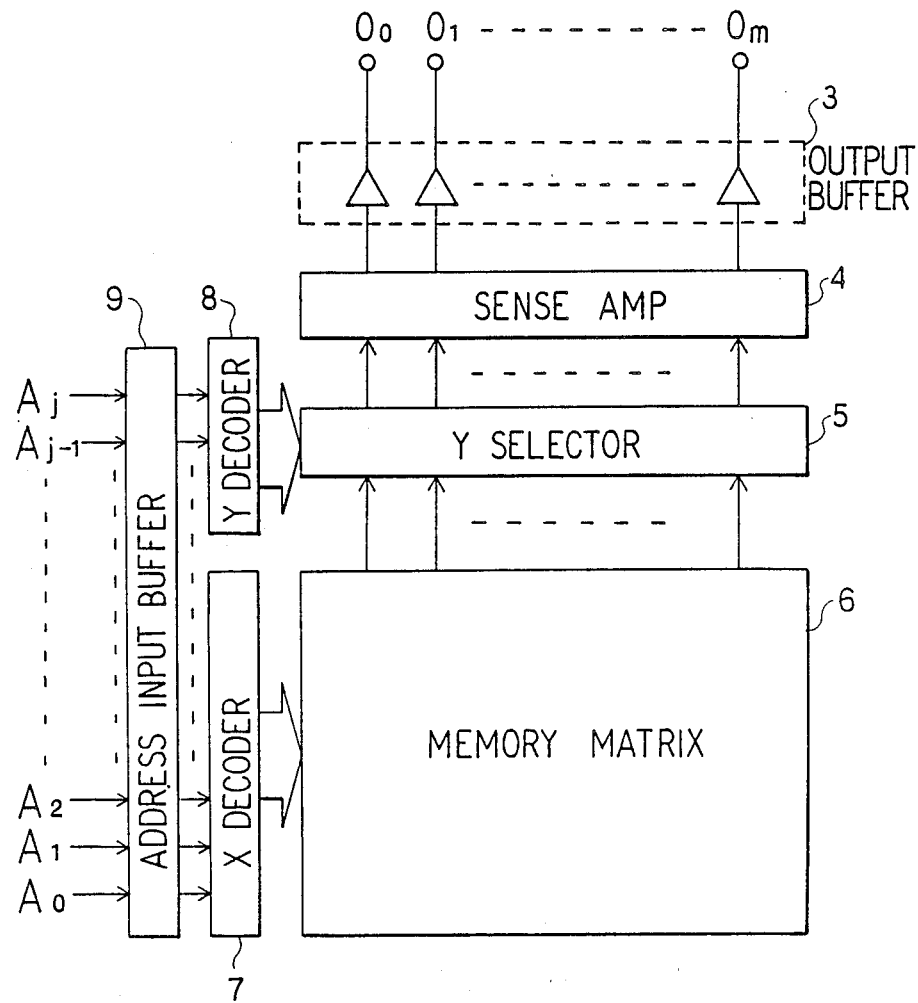
FIG. 1 is a block diagram of a conventional ROM.

Referring to FIG. 1, there is shown a conventional ROM which includes a memory cell matrix 6 having a plurality of parallel outputs, which are in turn connected through a Y-selector 5, a sense amplifier 4 and an output buffer 3 to a number of output or external terminals $O_0, O_1 \ldots O_m$. On the other hand, address inputs $A_0, A_1 \ldots A_{j-1}, A_j$ are connected to an address input buffer 9, whose outputs are connected to a X-decoder 7 and a Y-decoder 8. The X-decoder 7 is connected to the memory matrix 6 and the Y-decoder 8 is connected to the Y-selector.

With this arrangement, an address data is inputted into the address input buffer, the X-decoder 7 and the Y-decoder 8 cooperate to select memory cells to be read out. As a result, the data stored in the selected memory cells is read out through the Y-selector 5 and detected by the sense amplifier 4, whose outputs are further amplified by the output buffer 3 and outputted to the external terminals.

In the above mentioned conventional ROM, the change of the memory structure requires another layout of an integrated circuit, which is very expensive.

Figure 2:
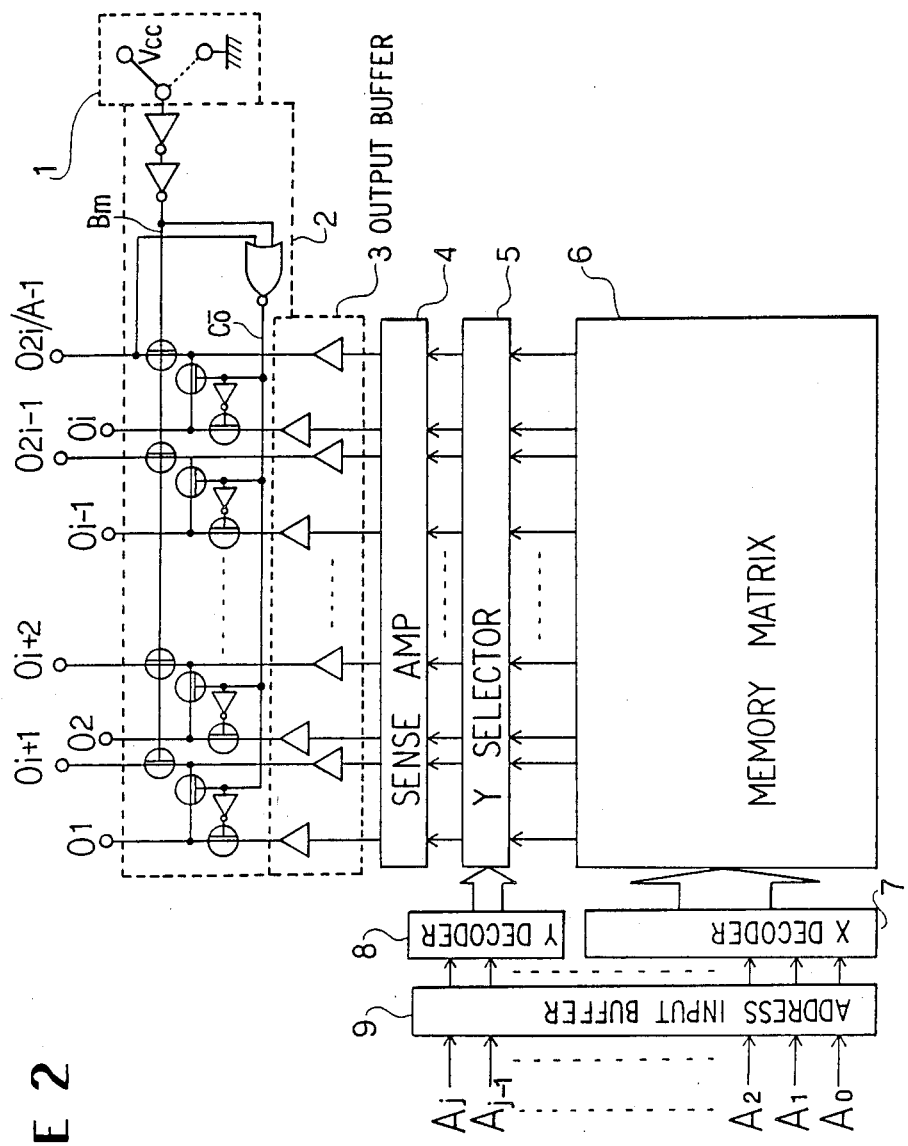
FIG. 2 is a block diagram of a first embodiment of the ROM in accordance with the present invention.

Turning to FIG. 2, there is shown a first embodiment of the ROM constructed in accordance with the present invention. In FIG. 2, elements similar to those shown in FIG. 1 are given the same Reference numerals and explanation will be omitted. As seen from comparison between FIGS. 1 and 2, the ROM shown in FIG. 2 comprises an output selection logical circuit 2 connected between the output lines of the output buffer 3 and output or external terminals $O_1, O_2 \ldots O_{i-1}, O_i, O_{i+1} \ldots O_{2i-1}, O_{2i}/A_{-1}$ 1, which are divided into i pairs. Namely, the first pair consists of the external terminals $O_1$ and $O_{i+1}$, the second pair of $O_2$ and $O_{i+2}$, ... the (i−1)th pair of $O_{i-1}$ and $O_{2i-1}$, and the (i)th pair of $O_i$ and $O_{2i}/A_{-1}$. The logical circuit 2 is associated with a mode selector 1.

Figure 3:
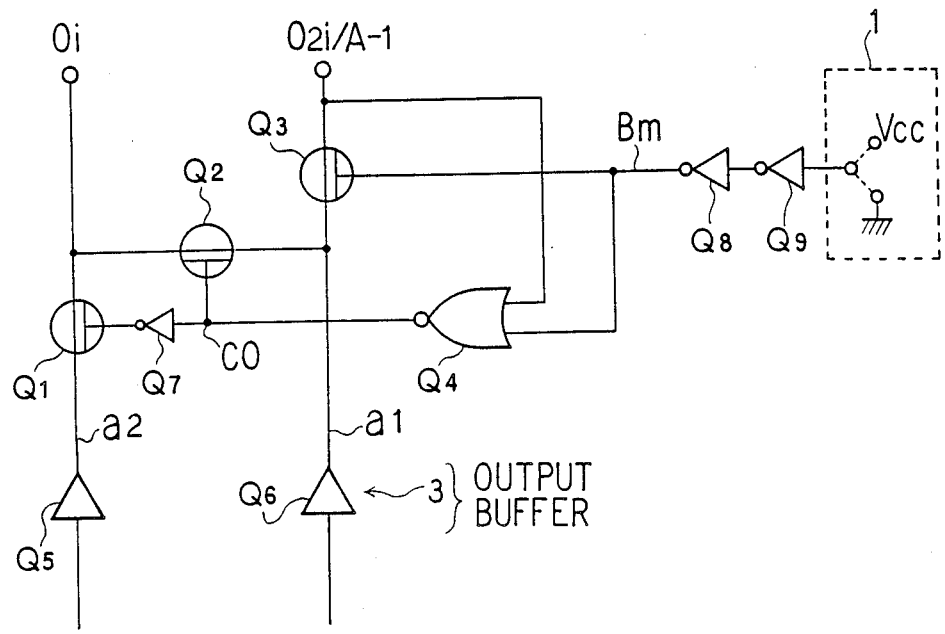
FIG. 3 is a circuit diagram of a portion of the output section of the ROM shown in FIG. 2.

As shown in more detail in FIG. 3 which shows the output circuit portion including the final pair of external terminals $O_i$ and $O_{2i}/A_{-1}$, the logical circuit 2 includes a pass-through transfer gates $Q_1$ connected between the first external terminal $O_i (O_1, O_2 \ldots O_i)$ of each external terminal pair and the output of the corresponding buffer amplifier $Q_5$. Also, an isolation transfer gate $Q_3$ is connected between the second external terminal $Q_{2i}/A_{-1}$ $(O_{i+1}, O_{i+2} \ldots O_{2i-1}, O_{2i}/A_{-1})$ of each external terminal pair and the output of the corresponding buffer amplifier $Q_6$. Further, each first external terminal $O_i$ is connected through a cross transfer gate $Q_2$ to the connection node between the isolation transfer gate $Q_3$ and the corresponding buffer amplifier $Q_6$.

Furthermore, the second external terminal $Q_{2i}/A_{-1}$ of the final external terminal pair is connected to one input of a NOR gate $Q_4$, whose output CO is connected directly to a gate electrode of each cross transfer gate $Q_2$ and also connected through an inverter $Q_7$ to a gate gate electrode of each pass-through gate $Q_2$.

The mode selector 1 includes a switch adapted to be connected to either the ground or a positive supply voltage Vcc in accordance with a code mask used in the course of memory production. An fixed terminal of the switch is connected through two cascade-connected inverters $Q_8$ and $Q_9$ to a gate electrode of each isolation transfer gate $Q_3$ and another input of the NOR gate $Q_4$.

With this construction, if the mode selector 1 is connected to Vcc, the output signal Bm of the inverter $Q_8$ is at a high level, so that the output signal CO of the NOR gate $Q_4$ is maintained at a low level irrespectively of the signal level of the external terminal $O_{2i}/A_{-1}$. Thus, the pass-through transfer gate $Q_1$ and the isolation transfer gate $Q_3$ are fixed in an ON condition while the cross transfer gate $Q_2$ is fixed in an OFF condition. Therefore, the output signals $a_2$ and $a_1$ of the buffer amplifiers $Q_5$ and $Q_6$ are outputted to the external terminals $O_i$ and $O_{2i}/A_{-1}$, respectively. Namely, all the external terminals are used as data outputs, and the circuit shown in FIG. 3 acts as two-bit memory output.

On the other hand, if the mode selector 1 is connected to the ground, the output Bm of the inverter $Q_8$ is at a low level. Therefore, the isolation transfer gate $Q_3$ is fixed in the OFF condition, so that the external terminal $O_{2i}/A_{-1}$ is isolated from the output $a_1$ of the buffer amplifier $Q_6$. On the other hand, the output CO of the NOR gate $Q_4$ is determined by the logical level of the external terminal $Q_{2i}/A_{-1}$. Therefore, in this case, the terminal $O_{2i}/A_{-1}$ can be used as an additional address input. If the terminal $O_{2i}/A_{-1}$ is at a high level, the gate $Q_1$ is put in an ON condition while the gate $Q_2$ is put in an OFF condition. Therefore, the output $a_2$ of the buffer amplifier $Q_5$ is outputted to the terminal $Q_1$. If the terminal $Q_{2i}/A_{-1}$ is at a low level, the gate $Q_1$ is OFF and the gate $Q_2$ is ON so that the output $a_1$ of the buffer amplifier $Q_6$ is outputted to the terminal $O_i$. Therefore, the circuit portion shown in FIG. 3 functions as one-bit memory output.

Figures 6, 7:
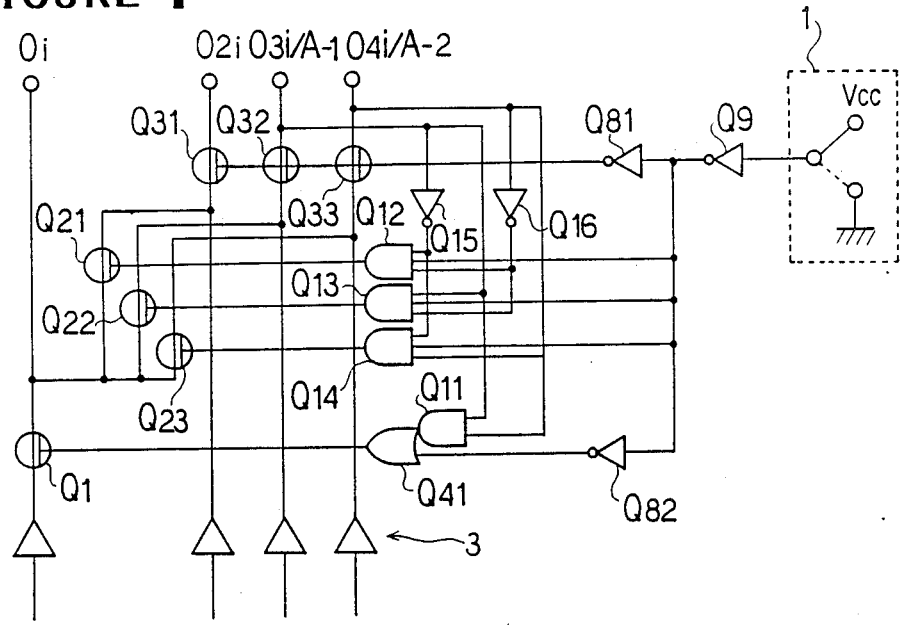
FIG. 6 is a table showing logical levels and signal conditions at various points in the circuit shown in FIG. 3.
FIG. 7 is a diagram similar to FIG. 3 but showing a second embodiment of the ROM in accordance with the present invention.

FIG. 6 shows the logical conditions and the signal conditions at various points as mentioned above.

Figure 4:
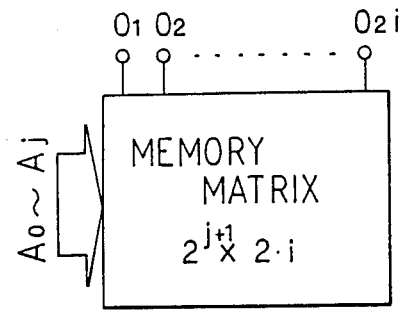
FIGS. 4 and 5 illustrates the memory structures which can be selected in the ROM shown in FIG. 2.
Figure 5:
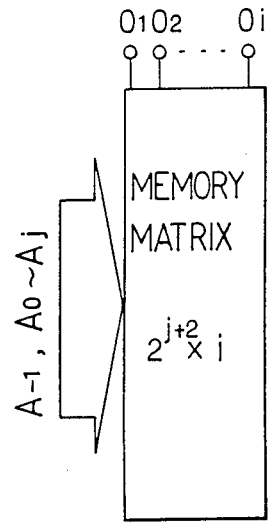

As seen from the above, if the mode selector 1 is connected to Vcc by selection of a code mask used in the course of memory production process, the ROM has the address inputs $A_o \ldots A_j$ and the output bits $O_1 \ldots O_{2i}$, i.e., the memory structure of $2^{j+1}$ words of 2 i bits, as shown in FIG. 4. In this case, all the address terminals and the external terminals are used. On the other hand, if the mode selector 1 is connected to the ground by selection of another code mask, the ROM has the address inputs $A_{-1}, A_o \ldots A_j$ and the output bits $O_1 \ldots Q_i$, i.e., the memory structure of $2^{j+2}$ words of i bits, as shown in FIG. 5. In this case, since the additional address input is given by the external terminal $O_{2i}/A_{-1}$ which is one of the external terminals not used, it is not necessary to increase the terminals of the ROM.

The above modification of the memory structure can be easily realized by selection of a code mask used in an ion implantation, a contact formation or any one of other various steps in the course of memory fabrication process. Therefore, different structures of memories can be produced in the same fabrication process just till the fixing of the connection pattern of the mode selector. This will results in greatly increased productivity, and does not require two different memory designs for two different structures of memories.

Turning to FIG. 7, there is shown another embodiment of the ROM in accordance with the present invention. This ROM has (j+1) address inputs $A_o \ldots A_j$ (not shown) and 4i external terminals $O_1, O_2 \ldots, O_i, \ldots, O_{2i}, \ldots, O_{3i}/A_{-1}, \ldots, O_{4i}/A_{-2}$, (only a portion is shown). Further, each four external terminals constitute one external terminal group. A first external terminal $O_i$ of each external terminal group is connected through a pass-through transfer gate $Q_1$ to the corresponding buffer amplifier 3. The remaining three external terminals $O_{2i}, O_{3i}/A_{-1}$ and $O_{4i}/A_{-2}$ of each group are connected to the corresponding buffer amplifiers 3 through three isolation transfer gates $Q_{31}, Q_{32}$ and $Q_{23}$, respectively. Further, the external terminal $O_i$ is connected through three cross transfer gates $Q_{21}, Q_{22}$ and $Q_{33}$ to the outputs of the buffer amplifiers 3 which are connected to the transfer gates $Q_{31}, Q_{32}$ and $Q_{33}$.

With the above arrangement, the mode selector 1 is connected through two cascade-connected inverters $Q_{81}$ and $Q_9$ to the gate electrodes of all the isolation transfer gates $Q_{31}, Q_{32}$ and $Q_{33}$. The output of the inverter $Q_9$ is connected through an inverter 82 and an OR gate $Q_{41}$ to the gate electrode of the pass-through transfer gate $Q_1$. The external terminals $Q_{3i}/A_{-1}$ and $O_{4i}/A_{-2}$ are connected to a decoder which includes four AND gates $Q_{11}, Q_{12}, Q_{13}$ and $Q_{14}$ and two inverters $Q_{15}$ and $Q_{16}$ connected as shown in FIG. 7 for decoding a binary data of two bits. The AND gate $Q_{11}$ is a two-input AND gate whose output is connected to another input of the OR gate $Q_{41}$. The AND gates $Q_{12}, Q_{13}$ and $Q_{14}$ are three-input AND gates, each of which has its one input connected to the output of the inverter $Q_9$. The AND gates $Q_{12}, Q_{13}$ and $Q_{14}$ are connected at their outputs to the gate electrodes of the cross transfer gates $Q_{21}, Q_{22}$ and $Q_{23}$, respectively. The terminal $O_{3i}/A_{-1}$ is connected directly to the AND gates $Q_{11}$ and $Q_{13}$ and also through the inverter $Q_{15}$ to the AND gates $Q_{12}$ and $Q_{14}$. The terminal $Q_{3i}/A_{-2}$ is connected to directly to the AND gates $Q_{11}$ and $Q_{14}$ and through the inverter $Q_{16}$ to the AND gates $Q_{12}$ and $Q_{13}$.

With this construction, if the mode selector 1 is connected to Vcc, the output signal of the inverters $Q_{81}$ and $Q_{82}$ is at a high level, so that the output signal of the OR gate $Q_{41}$ is maintained at a low level irrespectively of the signal level of the external terminals $Q_{3i}/A_{-1}$ and $O_{4i}/A_{-2}$. Thus, the pass-through transfer gate $Q_1$ and the isolation transfer gates $Q_{31}, Q_{32}$ and $Q_{33}$ are fixed in an ON condition. On the other hand, since the output of the inverter $Q_9$ is low, the outputs of the AND gates $Q_{12}, Q_{13}$ and $Q_{14}$ are fixed at a low level, so that the cross transfer gates $Q_{21}, Q_{22}$ and $Q_{23}$ are fixed in an OFF condition. Therefore, the output signals of the buffer amplifiers 3 are outputted to the external terminals $O_i, O_{2i}, O_{3i}/A_{-1}$ and $O_{4i}/A_{-1}$, respectively. Namely, all the external terminals are used as data outputs. Therefore, the ROM has the address inputs $A_o \ldots A_j$ and the output bits $O_i \ldots O_{4i}/A_{-2}$, i.e., the memory structure of $2^{j+1}$ words of 4 i bits.

On the other hand, if the mode selector 1 is connected to the ground, the output of the inverter $Q_{81}$ is at a low level. Therefore, the isolation transfer gates $Q_{31}, Q_{32}$ and $Q_{33}$ are fixed in the OFF condition, so that the external terminals $O_{2i}, O_{3i}/A_{-1}$ and $O_{4i}/A_{-2}$ are isolated from the outputs of the associated buffer amplifiers. On the other hand, the conditions of the transfer gates $Q_1, Q_{21}, Q_{22}$ and $Q_{23}$ are determined by the logical levels of the terminals $O_{3i}/A_{-1}$ and $O_{4i}/A_{-2}$. Therefore, these external terminals are used as additional address inputs. With the terminals $O_{3i}/A_{-1}$ and $O_{4i}/A_{-2}$ of "1, 1", the transfer gate $Q_1$ is ON, and $Q_{21}, Q_{22}$ and $Q_{23}$ are OFF. With the combination of "0, 0", he transfer gate $Q_{21}$ is ON, and $Q_1, Q_{22}$ and $Q_{23}$ are OFF. With "1, 0", $Q_{22}$ is ON, and $Q_1, Q_{21}$ and $Q_{23}$ are OFF. Further, with "0, 1", $Q_{23}$ is ON and $Q_1, Q_{21}$ and $Q_{22}$ are OFF. Therefore, the ROM has the address inputs $A_{-2}, A_{-1}, A_o \ldots A_j$ and the output bits $O_1 \ldots O_i$, i.e., the memory structure of $2^{j+4}$ words of i bits.

The invention has thus been shown and described with reference to specific embodiments. However, it should be noted that the invention is in no way limited to the details of the illustrated structures but changes and modifications may be made within the scope of the appended claims.

What is claimed is:

1. An integrated circuit memory comprising a memory cell matrix having a plurality of groups of output lines each group including at least two output lines; a plurality of groups of external terminals each group including at least two external terminals; output selection means connected between the output lines and the external terminals and adapted to connect the output lines to the corresponding external terminals in a first mode and to alternatively connect output lines of each output line group to one predetermined external terminal of the corresponding external terminal group in a second mode; control means connected to at least one given external terminal which is disconnected from the corresponding output line when the output selecting means is in the second mode, the control means being in response to a signal from the given external terminal to control the output selection means so as to cause it to selectively connect one output line of each output line group to the above predetermined external terminal of the corresponding external terminal group; and mode selection means associated to the output selection means and having a circuit structure fixed by a selected code mask so as to put the output selection means in a predetermined one of the first and second modes.

2. A memory as claimed in claim 1 wherein the output selection means includes pass-through transfer gate means connected between the above predetermined external terminal of each external terminal group and the corresponding one output line of the corresponding output line group, cross transfer gate means connected between the above predetermined external terminal of each external terminal group and at least one remaining output line of the same output line group, and isolation transfer gate means connected between at least one remaining external terminal of each external terminal group and the corresponding output line, so that when the output selection means is in the first mode, the pass-through and isolation transfer gate means are put in an ON condition while the cross transfer gate means are put in an OFF condition, and when the output section means is in the second mode, the isolation transfer gate means is put in an OFF condition and the pass-through and cross transfer gate means are alternatively put in an ON condition and in an OFF condition by the control means.

3. A memory as claimed in claim 2 wherein the control means includes one input connected to the given external terminal and an output connected directly to one of the pass-through and cross transfer gate means and though an inverter to the other of the pass-through and cross transfer gate means.

4. A memory as claimed in claim 3 wherein the control means includes an OR gate connected at its one input to the given external terminal and wherein the mode selection means is connected at its output to the isolation transfer gate means and another input of the OR gate, the mode selection means having an input selectively and fixedly connected to one of the ground and a supply voltage in accordance with the selected code mask.

5. A memory as claimed in claim 4 wherein the mode selection means includes two cascade-connected inverters.

6. A memory as claimed in claim 2 wherein the memory cell matrix has (j+1) address input lines and 2i output lines divided into i groups each including two output lines, and wherein the output selection means is in the first mode so that the memory has the memory structure of $2^{j+1}$ words of 2i bits.

7. A memory as claimed in claim 2 wherein the memory cell matrix has (j+1) address input lines and 2i output lines divided into i groups each including two output lines, and wherein the output selection means is in the second mode so that the given external terminal is used as an additional address input and the memory has the memory structure of $2^{j+2}$ words of i bits.

8. A memory as claimed in claim 2 wherein the memory cell matrix has (j+1) address input lines and 4i output lines divided into i groups each including four output lines, wherein the cross transfer gate means includes first, second and third cross transfer gates connected at their one end to the predetermined external terminal of each external terminal group, the other ends of these cross transfer gates being connected to the remaining three output lines of the corresponding output line group, respectively, and wherein the isolation transfer gate means includes three isolation transfer gates between the remaining three output lines of each output line group and the corresponding external terminals, respectively, so that when the output selection means is in the second mode, all the isolation transfer gates are put in an OFF condition, and the pass-through transfer gate means and the first, second and third transfer gates are alternatively put in an ON condition by the control means.

9. A memory as claimed in claim 8 wherein the mode selection means includes a first output connected to all the isolation transfer gates and a second output adapted to have the same logical level as that of the first output and connected to all the pass-through transfer gate means, the mode selection means also including an input selectively and fixedly connected to one of the ground and a supply voltage in accordance with the selected code mask.

10. A memory as claimed in claim 9 wherein the control means includes a decoder having two inputs connected to two given external terminals which are disconnected from the corresponding output lines when the output selection means is in the first mode, the decoder having four outputs connected to the pass-through transfer gate means and the first, second and third cross transfer gates, respectively, so as to put one of these transfer gates in the ON condition, the decoder being adapted to be activated by the mode selection means when the output selection means is in the second mode.

11. A memory as claimed in claim 8 wherein the output selection means is in the first mode so that the memory has the memory structure of $2^{j+1}$ words of 4i bits.

12. A memory as claimed in claim 8 wherein the output selection means is in the second mode so that the two given external terminals are used as additional address inputs and the memory has the memory structure of $2^{j+4}$ words of i bits.

13. An integrated circuit memory comprising a memory cell matrix having at least first and second output lines; at least first and second external terminals; output selection means connected between the output lines and the external terminals and adapted to connect the first and second output lines to the corresponding first and second external terminals in a first mode and to alternatively connect the first and second output lines to the first external terminal in a second mode; control means connected to the second external terminal and in response to a signal from the second external terminal when the output selecting means is in the second mode, to control the output selection means so as to cause it to selectively connect one of the output lines to the first external terminal; and mode selection means associated to the output selection means and having a circuit structure fixed by a selected code mask so as to put the output selection means in a predetermined one of the first and second modes.

14. A memory as claimed in claim 13 wherein the output selection means includes pass-through transfer gate means connected between the first external terminal and the corresponding first output line, cross transfer gate means connected between the first external terminal and the second output line, and isolation transfer gate means connected between the second external terminal and the corresponding second output line, so that when the output selection means is in the first mode, the pass-through and isolation transfer gate means are put in an ON condition while the cross transfer gate means are put in an OFF condition, and when the output section means is in the second mode, the isolation transfer gate means is put in an OFF condition and the pass-through and cross transfer gate means are alternatively put in an ON condition and in an OFF condition by the control means.

15. A memory as claimed in claim 14 wherein the control means includes one input connected to the second external terminal and an output connected directly to one of the pass-through and cross transfer gate means and though an inverter to the other of the pass-through and cross transfer gate means.

16. A memory as claimed in claim 15 wherein the control means includes an OR gate connected at its one input to the second external terminal and wherein the mode selection means is connected at its output to the isolation transfer gate means and another input of the OR gate, the mode selection means having an input selectively and fixedly connected to one of the ground and a supply voltage in accordance with the selected code mask.

17. A memory as claimed in claim 14 wherein the memory cell matrix has at least four output lines and the memory has at least four external terminals, wherein the pass-through transfer gate means is between the first external terminal of the four external terminals and the first output line of the four output lines, wherein the cross transfer gate means includes first, second and third cross transfer gates connected at their one end to the first external terminal, the other ends of these cross transfer gates being connected to the remaining three output lines, respectively, and wherein the isolation transfer gate means includes three isolation transfer gates between the remaining three output lines and the corresponding external terminals, respectively, so that when the output selection means is in the second mode, all the isolation transfer gates are put in an OFF condition, and the pass-through transfer gate means and the first, second and third transfer gates are alternatively put in an ON condition by the control means.

18. A memory as claimed in claim 17 wherein the mode selection means includes a first output connected to all the isolation transfer gates and a second output adapted to have the same logical level as that of the first output and connected to all the pass-through transfer gate means, the mode selection means also including an input selectively and fixedly connected to one of the ground and a supply voltage in accordance with the selected code mask.

19. A memory as claimed in claim 18 wherein the control means includes a decoder having two inputs connected to two given external terminals which are disconnected from the corresponding output lines when the output selection means is in the first mode, the decoder having four outputs connected to the pass-through transfer gate means and the first, second and third cross transfer gates, respectively, so as to put one of these transfer gates in the ON condition, the decoder being adapted to be activated by the mode selection means when the output selection means is in the second mode.

* * * * *

UNITED STATES PATENT AND TRADEMARK OFFICE
CERTIFICATE OF CORRECTION

PATENT NO. : 4,706,219
DATED : November 10, 1987
INVENTOR(S) : MIYATA ET AL

It is certified that error appears in the above-identified patent and that said Letters Patent is hereby corrected as shown below:

COLUMN 4, LINE 36   Delete "$O_{2i}/A$-1 1," and insert --$O_{2i}/A_{-1}$--.

Signed and Sealed this

Twenty-fifth Day of October, 1988

Attest:

DONALD J. QUIGG

Attesting Officer

Commissioner of Patents and Trademarks